United States Patent
Hong et al.

(10) Patent No.: US 10,923,656 B2
(45) Date of Patent: Feb. 16, 2021

(54) SWITCHING ATOMIC TRANSISTOR AND METHOD FOR OPERATING SAME

(71) Applicant: Industry-University Cooperation Foundation Hanyang University, Seoul (KR)

(72) Inventors: Jin Pyo Hong, Seoul (KR); Gwang Ho Baek, Incheon (KR); Ah Rahm Lee, Gimhae-si (KR); Tae Yoon Kim, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 16/322,344

(22) PCT Filed: Jul. 12, 2017

(86) PCT No.: PCT/KR2017/007444
§ 371 (c)(1),
(2) Date: Jan. 31, 2019

(87) PCT Pub. No.: WO2018/012868
PCT Pub. Date: Jan. 18, 2018

(65) Prior Publication Data
US 2019/0198759 A1    Jun. 27, 2019

(30) Foreign Application Priority Data

Jul. 12, 2016  (KR) ................ 10-2016-0087866
Jul. 26, 2016  (KR) ................ 10-2016-0094517

(51) Int. Cl.
*H01L 45/00*      (2006.01)
*G11C 13/00*     (2006.01)
(Continued)

(52) U.S. Cl.
CPC ...... *H01L 45/1266* (2013.01); *G11C 11/5614* (2013.01); *G11C 13/0011* (2013.01);
(Continued)

(58) Field of Classification Search
CPC ....... H01L 45/00; H01L 29/417; H01L 29/66; H01L 29/732; G11C 13/0011; G11C 11/5607
See application file for complete search history.

(56) References Cited

U.S. PATENT DOCUMENTS 6,798,017 B2 *  9/2004  Furukawa ........... H01L 29/7827
                                                                        257/329
7,935,598 B2 *  5/2011  Lee ...................... H01L 29/7827
                                                                        257/E21.41
(Continued)

FOREIGN PATENT DOCUMENTS

JP    2013-535805 A    9/2013
KR   10-2008-0038045 A    5/2008
(Continued)

OTHER PUBLICATIONS

International Search Report for PCT/KR2017/007444 dated Nov. 6, 2017 [PCT/ISA/210].
(Continued)

*Primary Examiner* — Son L Mai
(74) *Attorney, Agent, or Firm* — Sughrue Mion, PLLC

(57) ABSTRACT

Disclosed are a switching atomic transistor with a diffusion barrier layer and a method of operating the same. By introducing a diffusion barrier layer in an intermediate layer having a resistance change characteristic, it is possible to minimize variation in the entire number of ions in the intermediate layer involved in operation of the switching atomic transistor or to eliminate the variation to maintain stable operation of the switching atomic transistor. In addi-
(Continued)

tion, it is possible to stably implement a multi-level cell of a switching atomic transistor capable of storing more information without increasing the number of memory cells. Also, disclosed are a vertical atomic transistor with a diffusion barrier layer and a method of operating the same. By producing an ion channel layer in a vertical structure, it is possible to significantly increase transistor integration.

16 Claims, 8 Drawing Sheets

(51) Int. Cl.
*H01L 29/732* (2006.01)
*G11C 11/56* (2006.01)
*H01L 29/417* (2006.01)
*H01L 29/66* (2006.01)
*H01L 27/24* (2006.01)

(52) U.S. Cl.
CPC ........ *H01L 27/2454* (2013.01); *H01L 29/417* (2013.01); *H01L 29/66* (2013.01); *H01L 29/732* (2013.01); *H01L 45/00* (2013.01); *H01L 45/1206* (2013.01); *H01L 45/1233* (2013.01); *H01L 45/145* (2013.01); *H01L 45/1658* (2013.01); *G11C 2213/15* (2013.01); *G11C 2213/52* (2013.01); *G11C 2213/53* (2013.01)

(56) References Cited

U.S. PATENT DOCUMENTS

| | | | |
|---|---|---|---|
| 9,484,390 B2* | 11/2016 | Park | H01L 27/2454 |
| 2008/0099827 A1 | 5/2008 | Kreupl | |
| 2013/0079230 A1 | 3/2013 | Poppe et al. | |
| 2018/0261666 A1* | 9/2018 | Zeng | H01L 29/42376 |

FOREIGN PATENT DOCUMENTS

| | | |
|---|---|---|
| KR | 10-2009-0022764 A | 3/2009 |
| KR | 10-2010-0065427 A | 6/2010 |
| KR | 1 0-2011-0120406 A | 11/2011 |

OTHER PUBLICATIONS

Written Opinion for PCT/KR2017/007444 dated Nov. 6, 2017 [PCT/ISA/237].
International Preliminary Report on Patentability of PCT/KR2017/007444 dated Jan. 15, 2019 [PCT/IB/373].

* cited by examiner

S1

S2

S3

S4

S5

S6

● :METAL ATOMS (IONS)
→ :MIGRATION OF ELECTRONS

SWITCHING ATOMIC TRANSISTOR AND METHOD FOR OPERATING SAME

CROSS REFERENCE TO RELATED APPLICATIONS

This application is a National Stage of International Application No. PCT/KR2017/007444 filed Jul. 12, 2017, claiming priority based on Korean Patent Application Nos. 10-2016-0087866 filed Jul. 12, 2016 and 10-2016-0094517 filed Jul. 26, 2016.

TECHNICAL FIELD

The present invention relates to a switching atomic transistor and an operating method thereof, and more particularly, to a switching atomic transistor having memory characteristics using a conductive bridge, a vertical atomic transistor using the same, and a method of operating the same.

BACKGROUND ART

Due to the recent development of digital information communication and home appliance industry, there is a growing demand for low power and highly integrated devices, but conventional charge-control-based power consumption reduction and high integration of devices have reached their limits. In order to overcome the limits, studies on new memory devices are actively under way using a phase change in an organic or inorganic material, a change in a magnetic field, etc. In particular, new memory devices having an information storage method that uses the principle of changing the resistance of a material itself by inducing a change in the state of the material are attracting attention. For example, next-generation non-volatile memory devices include a phase-change RAM (PRAM), a magnetic RAM (MRAM), and a resistance change RAM (ReRAM).

In the case of flash memory, which is a representative non-volatile memory based on charge control, a high operating voltage is required for programming and erasing data. Accordingly, when a flash memory is produced while being scaled down with a line width of 45 nm or less, the flash memory may malfunction due to interference between adjacent cells and have problems due to slow operation speed and excessive power consumption.

Among new memory devices proposed as an alternative for solving the problems, the MRAM with non-volatile memory characteristics needs more research for commercialization because of a complicated manufacturing process, a multi-layer structure, and small margins for read/write operations. Accordingly, it is required to develop a next-generation non-volatile memory device with low power, high integration, and a low manufacturing process ratio to overcome shortcomings of such devices.

A conventional transistor is composed of three terminals, i.e., a source electrode, a drain electrode, and a gate electrode and operates a device by adjusting the carrier concentration of silicon. That is, by adjusting the voltage of the gate electrode, it is possible to adjust resistance between the source electrode and the drain electrode. A transistor has a characteristic in which a stored logic disappears at the same time when power is off, and therefore, a memory responsible for storage should be separately disposed in order to use a transistor as a computation element. Thus, a bottleneck occurs during storage and retrieval of data between the memory and the computation element, resulting in a slow-down of the transistor. Also, since a horizontal channel is used, there is a limitation to improving a degree of integration.

Also, for the next-generation non-volatile memory devices, attempts have been made to implement a multi-level cell such as a flash memory device. However, there is almost no next-generation non-volatile memory device that realizes reliable multi-level operation to the extent that it can be commercialized.

U.S. patent application Ser. No. 14/044,696 (filed on Oct. 2, 2013) and U.S. Ser. No. 11/209,025 (filed on Mar. 9, 2006) disclose semiconductor memory manufacturing steps using two-electrode methods. The manufacturing steps include a function of a device that operates after forming a conductive bridge in a resistor due to ion migration, but have low reliability in repetitive device operation caused by the formation of the conductive bridge in a resistance change layer.

U.S. patent application Ser. No. 13/871,040 (filed on Apr. 26, 2013) relates to a conductive-bridge resistive memory and discloses a method of manufacturing a programmable metallization cell (PMC) for resistive software (S/W) in a non-volatile memory. This structure can suppress leakage current by having a semiconductor layer between a memory layer and an ion supply layer, in order to decrease leakage current to improve device performance by lowering an electric field value during cell operation and by suppressing occurrence of defects in a high electric field. It is possible to reduce leakage current by having a two-electrode structure as a default structure and additionally having a semiconductor layer. However, an increase in resistance of a resistance change layer included in the semiconductor layer causes a reduction in reliability of non-volatile memory characteristics during repetitive operation.

Korean Patent Application No. 10-2013-0013264 (filed on Feb. 6, 2013) discloses a conductive bridge random access memory (CBRAM) that uses a growth rate difference of a filament, which is a conductive bridge, depending on the density of an insulating layer material by configuring a first insulating layer and a second insulating layer, lowering the density of the first insulating layer below that of the second insulating layer, installing a first metal on the other side of the first insulating layer, and installing a second metal on the other side of the second insulating layer. The CBRAM overcomes the limitation of an RAM and assigns a memory function, and adopts a two-electrode scheme of an operation method for forming and eliminating a conductive bridge formed by electrodeposition. For this device, it is difficult to maintain the growth rate difference of the filament during repetitive operation and thus reliability of the device is reduced.

U.S. patent application Ser. No. 13/347,840 (filed on Jan. 12, 2012) relates to a non-volatile resistive memory cell having an active layer and discloses a CBRAM of a two-electrode structure in which an active material is present between a first electrode and a second electrode formed of a metal or a metal silicide and a wall is present between the first electrode and the active material. The CBRAM has a two-electrode structure that has a conductive bridge formed due to migration of ions in the active layer and that performs a non-volatile memory function. A dielectric layer is not in contact with an ion source layer, unlike the present invention.

Japanese Patent Application No. 2012-42825 (filed on Feb. 29, 2012) relates to a storage device capable of performing miniaturization while maintaining good thermal insulation of the device. The storage device is composed of a first electrode, a storage layer, and a second electrode and has an insulating layer installed in a side wall of the storage layer. The storage device has a transistor (a metal-oxide-semiconductor field-effect transistor (MOSFET)) for controlling the first electrode. That is, for the storage device, it is difficult to reduce process costs due to complicated device production because a non-volatile memory device having a two-electrode structure is controlled by the transistor.

Recently, much research has been conducted on a conductive bridge memory (CBM) device, which is one field of ReRAM devices. A resistance state changes when a metal filament is formed and eliminated by oxidation and reduction reactions of metal atoms or metal ions penetrated from a metal electrode into a resistance change layer according to a voltage applied to the resistance change layer. Solid electrolyte materials such as an oxide or GeS are mainly used as the material of the resistance change layer which has been used so far. However, the solid electrolyte materials are very unstable in terms of a low resistance state, a high resistance state, and scattering characteristics of SET and RESET voltages, and it is difficult to perform device control by using the solid electrolyte materials. Therefore, it is necessary to develop a new material for the resistance change layer or to propose a new structure capable of always allowing stable operation during repetitive device control.

DETAILED DESCRIPTION OF THE INVENTION

Technical Problem

A first objective to be achieved by the present invention is to provide a switching atomic transistor that may form a conductive bridge and stably maintain the concentration of ions in the conductive bridge by introducing a diffusion barrier layer capable of selectively blocking diffusion of ions depending on levels of a voltage of an ion source gate electrode.

A second objective to be achieved by the present invention is to provide a method of operating the switching atomic transistor provided by achieving the first objective.

A third objective to be achieved by the present invention is to provide a vertical atomic transistor capable of significantly increasing device integration using the principle of the switching atomic transistor.

A fourth objective to be achieved by the present invention is to provide a method of operating the vertical atomic transistor provided by achieving the third objective.

Technical Solution

In order to achieve the first technical objective, the present invention provides a switching atomic transistor including a substrate, a source electrode formed on the substrate, a drain electrode formed on the substrate and spaced apart from the source electrode, an intermediate layer formed over the source electrode or the drain electrode to fill the space between the source electrode and the drain electrode, a diffusion barrier layer formed on the intermediate layer to prevent diffusion of ions of the intermediate layer, and an ion source gate electrode formed on the diffusion barrier layer to supply ions to the intermediate layer upon an initial operation.

The source electrode or the drain electrode may be formed of at least one material selected from the group consisting of p-doped Si, n-doped Si, WN, AlN, TaN, HfN, TiN, titanium oxynitride (TiON), and tungsten oxynitride (WON).

The intermediate layer may be formed of at least one material selected from the group consisting of CuInS, CuInSe, CuInS, CdInSe, MnInS, MnZnInS, ZnInSe, InS, InSSe, InSe, CdS, ZnCdS, ZnInS, a-Si, $SiO_2$, $Al_2O_3$, $Ta_2O_5$, metal oxides, crystalline $SiO_2$, crystalline $Al_2O_3$, and CuS.

The ion source gate electrode may be formed of at least one material selected from the group consisting of Cu, Ag, and alloys thereof.

The diffusion barrier layer may be formed of at least one material selected from the group consisting of WN, AlN, TaN, HfN, GaN, $SiN_x$, and $Si_3N_4$.

The switching atomic transistor may further include a capping layer formed on the ion source gate electrode to protect the ion source gate electrode.

The capping layer may be formed of at least one material selected from the group consisting of WN, AlN, TaN, HfN, TiN, TiON, and WON.

In order to achieve the second technical objective, the present invention provides a method of operating a switching atomic transistor including a source electrode formed on a substrate, a drain electrode formed on the substrate and spaced apart from the source electrode, an intermediate layer formed over the source electrode and the drain electrode to fill the space between the source electrode and the drain electrode, a diffusion barrier layer formed on the intermediate layer, and an ion source gate electrode formed on the diffusion barrier layer, the method including applying an overvoltage to the ion source gate electrode, enabling ions to migrate from the ion source gate electrode into the intermediate layer due to the overvoltage, applying a positive voltage to the ion source gate electrode so that ions migrate to a channel area inside the intermediate layer to form an ion layer, and applying a negative voltage to the ion source gate electrode so that ions migrate toward the ion source gate to eliminate the ion layer.

The applying of a positive voltage to the ion source gate electrode so that ions migrate to a channel area inside the intermediate layer to form an ion layer and the applying of a negative voltage to the ion source gate electrode so that ions migrate toward the ion source gate to eliminate the ion layer may include adjusting a source-drain current by adjusting the number of ions to be moved depending on levels of the voltage applied to the ion source gate electrode.

In order to achieve the third technical objective, the present invention provides a vertical atomic transistor including a substrate, a drain electrode formed on the substrate, an ion channel layer formed on the drain electrode and disposed perpendicularly to the substrate, a first diffusion barrier layer formed on a side surface of the ion channel layer, an ion source gate electrode formed in contact with an outer surface of the first diffusion barrier layer, a second diffusion barrier layer formed on the ion channel layer, and a source electrode formed on the second diffusion barrier layer.

The vertical atomic transistor may further include a first oxide layer formed between the ion source gate electrode and the substrate to space the drain electrode apart from the ion source gate electrode.

The first oxide layer may be formed of at least one material selected from the group consisting of CuInS, CuInSe, CuInS, CdInSe, MnInS, MnZnInS, ZnInSe, InS, InSSe, InSe, CdS, ZnCdS, ZnInS, a-Si, $SiO_2$, $Al_2O_3$, crystalline $SiO_2$, crystalline $Al_2O_3$, CuS, and metal oxides.

The first oxide layer may be formed under the first diffusion barrier layer and in contact with a lower area of the ion channel layer that is in contact with the first diffusion barrier layer.

The first oxide layer may completely shield a side surface of the drain electrode.

The vertical atomic transistor may further include a second oxide layer formed on a side surface of the second diffusion barrier layer over the first oxide layer to shield a portion of an exposed side surface of the ion channel layer.

The second oxide layer may be formed of at least one material selected from the group consisting of CuInS, CuInSe, CuInS, CdInSe, MnInS, MnZnInS, ZnInSe, InS, InSSe, InSe, CdS, ZnCdS, ZnInS, a-Si, $SiO_2$, $Al_2O_3$, crystalline $SiO_2$, crystalline $Al_2O_3$, CuS, and metal oxides.

Also in the vertical atomic transistor, a surface oxide layer may be further formed between the substrate and the drain electrode to achieve electrical insulation between the substrate and the drain electrode, and the surface oxide layer may be formed of at least one material selected from the group consisting of $SiO_2$, $Al_2O_3$, $ZrO_2$, $TaO_2$, $TiO_2$, $BaTiO_2$, $HfO_2$, and $Cu_2O$.

The drain electrode may be formed of at least one material selected from the group consisting of p-doped Si, n-doped Si, WN, AlN, TaN, HfN, TiN, TiON, and WON.

The ion channel layer may be formed of at least one material selected from the group consisting of CuInS, CuInSe, CuInS, CdInSe, MnInS, MnZnInS, ZnInSe, InS, InSSe, InSe, CdS, ZnCdS, ZnInS, a-Si, $SiO_2$, $Al_2O_3$, crystalline $SiO_2$, crystalline $Al_2O_3$, CuS, and metal oxides.

The first diffusion barrier layer or the second diffusion barrier layer may be formed of at least one material selected from the group consisting of WN, AlN, TaN, HfN, GaN, $SiN_x$, and $Si_3N_4$.

The ion source gate electrode may be formed of at least one material selected from the group consisting of Cu, Ag, and alloys thereof.

The source electrode may be formed of at least one material selected from the group consisting of Cu, Ag, and alloys thereof.

In order to achieve the fourth technical objective, the present invention provides a method of operating a vertical atomic transistor having an ion channel layer formed perpendicularly to a substrate, a source electrode and a drain electrode formed over and under the ion channel layer, and an ion source gate electrode formed in contact with a side surface of the ion channel layer, the method including applying an overvoltage to the source electrode so that metal ions migrate from the source electrode into the ion channel layer to form a conductive bridge, applying a negative voltage to the ion source gate electrode so that the ions forming the conductive bridge in the ion channel layer migrate toward a first diffusion prevention layer to remove a portion of the conductive bridge, and applying a positive voltage to the ion source gate electrode so that the ions forming the conductive bridge in the ion channel layer migrate to a center of the ion channel layer to form the conductive bridge.

The formation or elimination of the conductive bridge in the ion channel layer may be maintained even when no voltage is applied to the source electrode, the drain electrode, and the ion source gate electrode.

The applying of a negative voltage to the ion source gate electrode so that the ions forming the conductive bridge in the ion channel layer migrate toward a first diffusion prevention layer to remove a portion of the conductive bridge and the applying of a positive voltage to the ion source gate electrode so that the ions forming the conductive bridge in the ion channel layer migrate to a center of the ion channel layer to form the conductive bridge may include providing a multi-level resistance value by applying different voltages on a step basis to adjust the number of ions migrated in the ion channel layer.

Advantageous Effects of the Invention

According to the present invention, by introducing a diffusion barrier layer between an ion source gate electrode and an intermediate layer, it is possible to stably maintain the concentration of ions forming a conductive bridge in the intermediate layer according to voltage of the gate electrode and to maintain stable operation of a transistor.

Also, the concentration of ions in a channel area is adjusted using an electric field and the ions do not migrate while power supply is cut off, and thus it is possible to implement a non-volatile memory characteristic of the transistor.

In addition, even when power supply is cut off, it is possible to achieve a design capable of processing computation and storage at one time using a storage function of the transistor and also to apply to a neuromorphic computer and next-generation computing.

In a conventional memory, when a device size is reduced, a channel length is shortened and thus it is impossible to operate the memory. However, the transistor of the present invention has an operating characteristic caused by a conductive bridge formed by ions, and thus it is possible to scale down the transistor to a unit of several atoms.

The vertical atomic transistor according to an embodiment of the present invention is a transistor formed in a vertical structure, and thus may shorten a width of an ion channel layer. Accordingly, it is possible to remarkably increase device integration.

It should be noted that technical effects of the present invention are not limited to the above-described effects, and other effects that are not described herein will be apparent to those skilled in the art from the following descriptions.

MODE OF THE INVENTION

Figure 1:
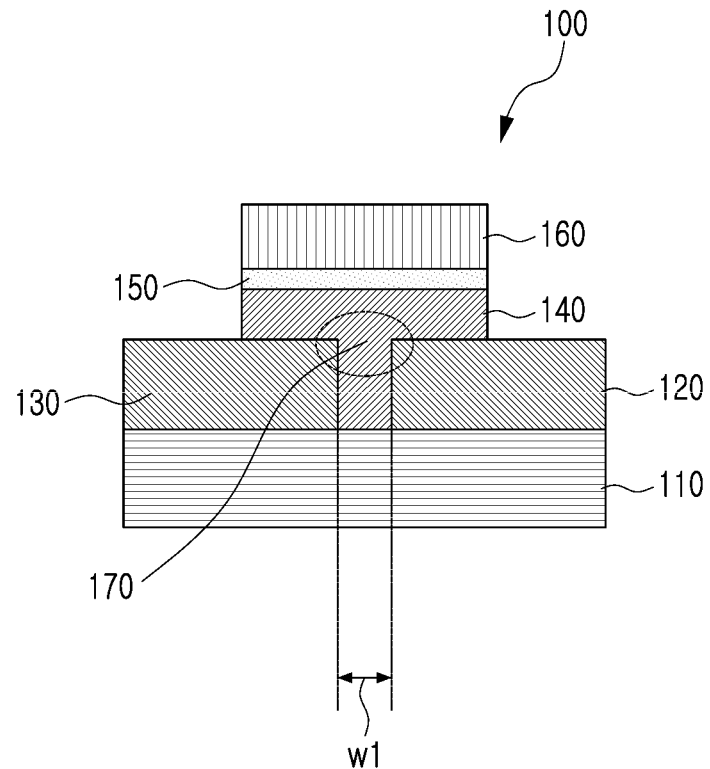
FIG. 1 is a sectional view of a switching atomic transistor according to an embodiment of the present invention.

Hereinafter, embodiments of the present invention will be described in detail with reference to the accompanying drawings.

The present invention may be embodied in many different forms, and specific embodiments thereof illustrated in the drawings will be described in detail. However, the present invention is not limited to the specific embodiments described below, but rather the present invention includes all alternatives, modifications, and equivalents falling within the spirit of the present invention defined by the appended claims.

It will be understood that when an element such as a layer, region, or substrate is referred to as being "on" another element, it can be directly on the other element or intervening elements may also be present.

It will be understood that, although the terms first, second, etc. may be used herein to describe various elements, components, areas, layers, and/or regions, these elements, components, areas, layers, and/or regions are not be limited by these terms.

Embodiment 1: Switching Atomic Transistor

FIG. 1 is a sectional view of a switching atomic transistor 100 according to an embodiment of the present invention.

Referring to FIG. 1, the switching atomic transistor 100 includes a source electrode 130 formed on a substrate 110, a drain electrode 120 formed on the substrate 110 and spaced apart from the source electrode 130, an intermediate layer 140 formed on the source electrode 130 and the drain electrode 120 and configured to fill the space between the source electrode 130 and the drain electrode 120, a diffusion barrier layer 150 formed on the intermediate layer 140, and an ion source gate electrode 160 formed on the diffusion barrier layer 150.

The substrate 110 may be formed of at least one material selected from the group consisting of Si, $Al_2O_3$, SiC, $Si_3N_4$, GaAs, and GaN. Also, a surface oxide layer (not shown) may be formed on the substrate 110 and may be formed of any one material selected from the group consisting of $SiO_2$, $Al_2O_3$, crystalline $SiO_2$, and crystalline $Al_2O_3$. A general metallic material may be used for the substrate 110.

The source electrode 130 and the drain electrode 120 are formed on the substrate 110 and spaced apart from each other. The space between the source electrode 130 and the drain electrode 120 is preferably in the range of 2 nm to 20 nm, but the present invention is not limited thereto.

The source electrode 130 and the drain electrode 120 may be formed of at least one material selected from the group consisting of p-doped Si, n-doped Si, WN, AlN, TaN, HfN, TiN, titanium oxynitride (TiON), and tungsten oxynitride (WON).

The intermediate layer 140 is formed on some regions of the source electrode 130 and the drain electrode 120 and on a portion of the substrate 110 exposed to the space between the source electrode 130 and the drain electrode 120.

An amorphous semiconductor, a metal oxide, and a metal sulfide may be used as the material of the intermediate layer 140. For example, the material of the intermediate layer 140 may be at least one material selected from the group consisting of CuInS, CuInSe, CuInS, CdInSe, MnInS, MnZnInS, ZnInSe, InS, InSSe, InSe, CdS, ZnCdS, ZnInS, a-Si, $SiO_2$, $Al_2O_3$, crystalline $SiO_2$, crystalline $Al_2O_3$, CuS, and metal oxides, but the present invention is not limited thereto.

The intermediate layer 140 may have a thickness of 1 nm or more for normal operation of the switching atomic transistor, preferably between 1 nm and 10 nm.

The diffusion barrier layer 150 is formed on the intermediate layer 140. The diffusion barrier layer 150 may be formed of at least one material selected from the group consisting of WN, AlN, TaN, HfN, GaN, $SiN_x$, and $Si_3N_4$.

The ion source gate electrode 160 is formed on the diffusion barrier layer 150.

Any metal can be used for the ion source gate electrode 160 as long as the metal has a high diffusion coefficient in a solid so that metal ions can migrate due to an electric field. For example, the ion source gate electrode 160 may be formed of at least one material selected from the group consisting of Cu, Ag, and alloys thereof, but the present invention is not limited thereto.

In particular, when an alloy such as AgNi or CuTe is used as the material of the ion source gate electrode 160, over-injection of ions from the ion source gate electrode 160 is prevented when the switching atomic transistor is repeatedly driven, thereby further increasing stability of the switching atomic transistor.

The ion source gate electrode 160 may have a thickness of 1 nm to 100 nm.

Figure 2:
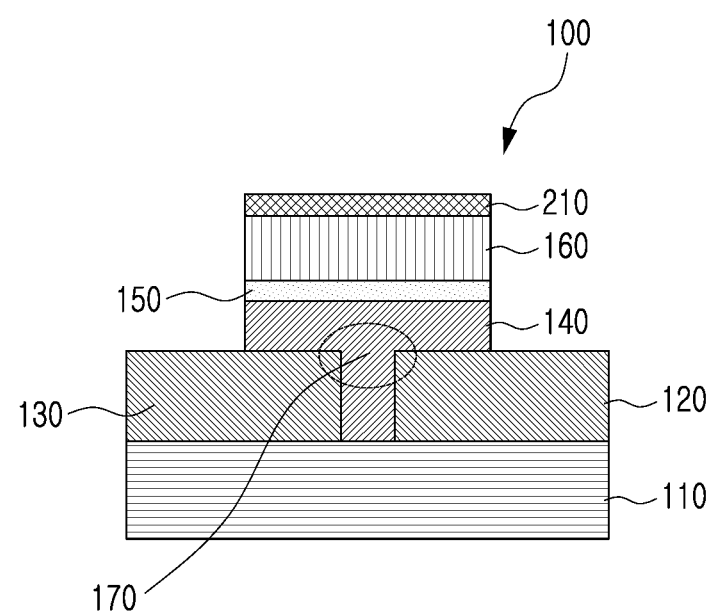
FIG. 2 is a sectional view of a switching atomic transistor additionally including a capping layer on an ion source gate electrode according to an embodiment of the present invention.

FIG. 2 is a sectional view of a switching atomic transistor 200 which further includes a capping layer 210 on the ion source gate electrode 160 according to an embodiment of the present invention.

Referring to FIG. 2, the capping layer 210 is formed on the ion source gate electrode 160 to prevent oxidation of the ion source gate electrode 160.

The capping layer 210 may be formed of at least one material selected from the group consisting of WN, AlN, TaN, HfN, TiN, TiON, and WON. Since the diffusion barrier layer 150 is present between the ion source gate electrode 160 and the intermediate layer 140, the transistor is hardly influenced by the oxidation of the ion source gate electrode 160. However, when the thickness of the ion source gate electrode 160 is designed to range from 1 nm to 5 nm, the oxidation of the ion source gate electrode 160 may adversely influence the diffusion barrier layer 150 and the intermediate layer 140. Accordingly, it is necessary to form the capping layer 210 on the ion source gate electrode 160 in order to minimize the influence of the oxidation of the ion source gate electrode 160.

Figure 3:
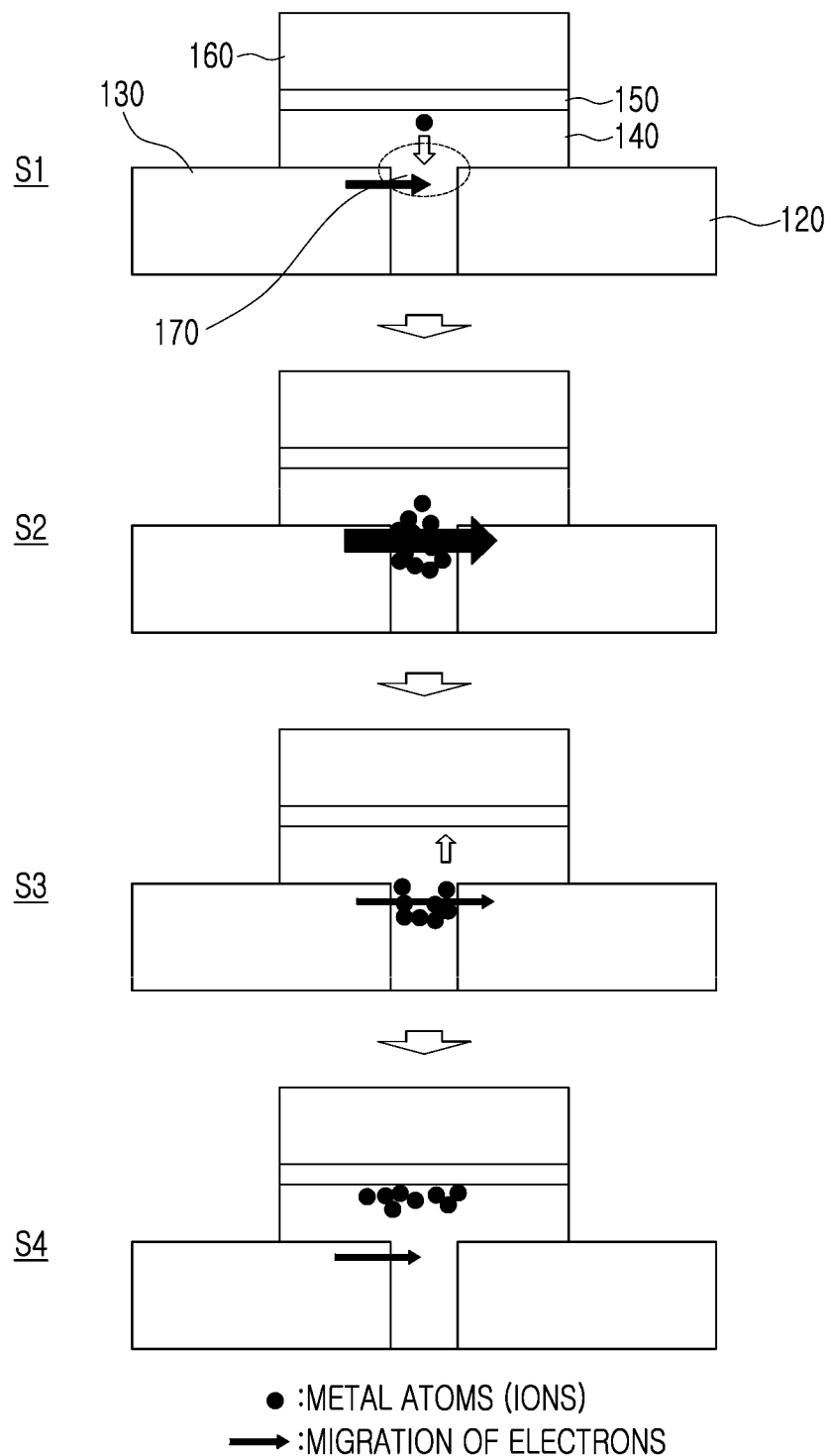
FIG. 3 is a schematic diagram illustrating migration of ions in an intermediate layer according to a gate voltage in a switching atomic transistor according to an embodiment of the present invention.

FIG. 3 is a schematic diagram illustrating migration of ions in the intermediate layer 140 according to the voltage of the gate electrode in the switching atomic transistor according to an embodiment of the present invention.

Referring to FIG. 3, an internal operation state of the switching atomic transistor 100 corresponding to a voltage applied to the ion source gate electrode 160 is modeled to be schematized and will be described step by step.

State S1 shows an initial state of the switching atomic transistor.

In order to transition to state S2, a voltage higher than a voltage applied to the ion source gate electrode 160 while the switching atomic transistor is repeatedly operated is applied upon an initial operation. The high voltage applied upon the initial operation causes ions from the ion source gate electrode 160 to pass through the diffusion barrier layer 150 and flow into the intermediate layer 140. The ions that have flowed into the intermediate layer 140 migrate to a channel area 170 by the voltage applied to the ion source gate electrode 160 and forms an ion layer, which serves as a conductive bridge. The conductive ion layer enables electric current to flow from the source electrode 130 to the drain electrode 120. That is, the source electrode 130 and the drain electrode 120 are turned on. After an appropriate number of ions flow into the intermediate layer 140, a high voltage such as that applied upon the initial operation is not applied to the ion source gate electrode 160. In other words, after an appropriate number of ions flow into the intermediate layer 140, a voltages is applied not for additional ion flow but for an iterative operation in which the ions migrates in the intermediate layer 140 to form or eliminate an ion layer.

When a voltage having a polarity opposite to that of the voltage applied to the ion source gate electrode 160 is applied to the ion source gate electrode 160 in state S2 in order to form the ion layer, the ion layer of the channel area 170 starts to decrease (S3) and finally the ion layer is removed from the channel area 170 (S4). That is, since the flow of electrons from the source electrode 130 to the drain electrode 120 disappears, no electric current flows and thus the internal operation state changes to an off state.

Hereinafter, the reference numerals of FIG. 1 will be used to describe a manufacturing example according to this embodiment.

Manufacturing Example 1

A source electrode 130 and a drain electrode 120 were formed on a substrate 110. The source electrode 130 and the drain electrode 120 were formed of TiN. An intermediate layer 140 was formed on some regions of the source electrode 130 and the drain electrode 120 and on a portion of the substrate 110 exposed to the space between the source electrode 130 and the drain electrode 120. The intermediate layer 140 was formed of $Ag_2S$. A diffusion barrier layer 150 was formed on the intermediate layer 140. The diffusion barrier layer 150 was formed of WN. The switching atomic transistor according to manufacturing example 1 was manufactured by forming an ion source gate electrode 160 on the diffusion barrier layer 150 using AgCu.

Ag ions of the intermediate layer 140 may migrate according to a voltage applied to the ion source gate electrode 160. Accordingly, when $Ag_2S$ is used for the intermediate layer 140 like manufacturing example 1, it is possible to omit a step of applying an overvoltage to the ion source gate electrode 160 to diffuse Cu ions into the intermediate layer 140 for the purpose of an initial operation.

Also, when the step of applying an overvoltage to the ion source gate electrode 160 to diffuse Cu ions or Ag ions into an ion channel layer is not omitted, the Cu ions or Ag ions that have migrated from the ion source gate electrode 160 is added to Ag ions present in the intermediate layer 140, so that the number of ions involved in the operation of the transistor increases in the intermediate layer 140. Therefore, there is an advantage in that the operation of the switching atomic transistor becomes possible at a low voltage.

Hereinafter, the reference numerals of FIG. 2 will be used to describe manufacturing examples according to this embodiment.

Manufacturing Example 2

A source electrode 130 and a drain electrode 120 were formed of TiN and to a thickness of 10 nm, and an intermediate layer 140 was formed of $Cu_2S$ and to a thickness of 15 nm. Also, an ion source gate electrode 160 was formed of CuAg and to a thickness of 10 nm, and a diffusion barrier layer 150 was formed of HfN and to a thickness of 10 nm. In manufacturing example 2, no capping layer 210 was formed on the ion source gate electrode 160.

In manufacturing example 2, since the thickness of the ion source gate electrode 160 was greater than or equal to 5 nm, a switching atomic transistor having less influence due to oxidation of the ion source gate electrode 160 was manufactured even without the formation of the capping layer 210.

Manufacturing Example 3

A source electrode 130 and a drain electrode 120 were formed of TiN and to a thickness of 10 nm, and an intermediate layer 140 was formed of CuTeS and to a thickness of 10 nm. Also, an ion source gate electrode 160 was formed of CuAg and to a thickness of 5 nm, and a diffusion barrier layer 150 was formed of HfN and to a thickness of 10 nm.

Also, a switching atomic transistor was manufactured by forming a capping layer 210 on the ion source gate electrode 160, of WN, and to a thickness of 5 nm or more.

Manufacturing Example 4

A source electrode 130 and a drain electrode 120 were formed of TiN and to a thickness of 10 nm, and an intermediate layer 140 was formed of CuTeS and to a thickness of 10 nm. Also, an ion source gate electrode 160 was formed of Cu and to a thickness of 5 nm, and a diffusion barrier layer 150 was formed of AlN and to a thickness of 10 nm.

Also, a switching atomic transistor was manufactured by forming a capping layer 210 on the ion source gate electrode 160, of TaN, and to a thickness of 5 nm or more.

Evaluation Example 1

Figure 4A:
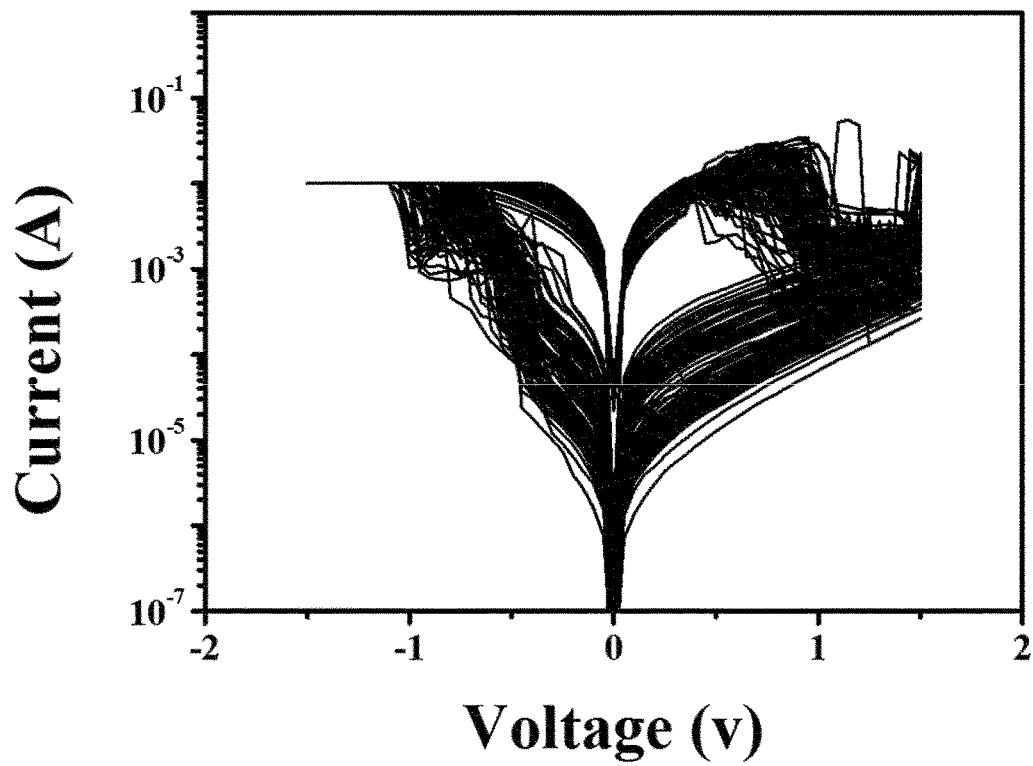
FIGS. 4A to 4C are characteristic graphs of a two-electrode structure switching atom device produced to evaluate operation of the device depending on the presence or absence of a diffusion barrier layer.
Figure 4B:
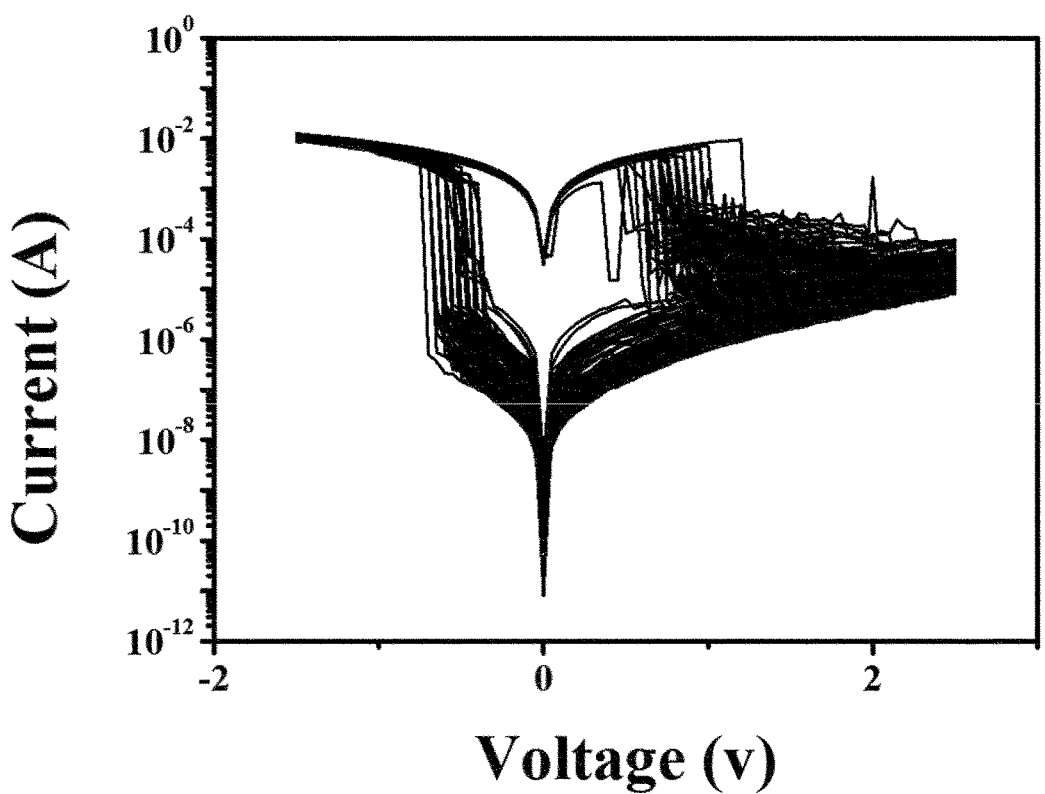
Figure 4C:
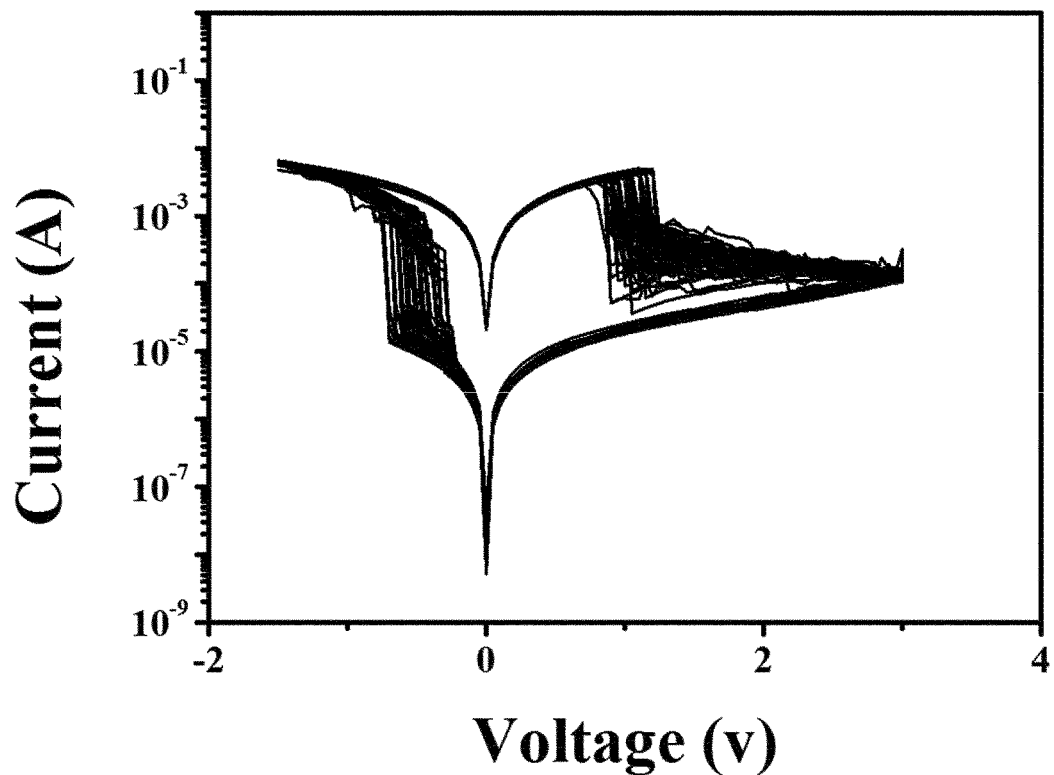

FIGS. 4A to 4C are characteristic graphs of a two-electrode structure switching atomic device produced to evaluate operation of the device depending on the presence or absence of a diffusion barrier layer.

Referring to FIG. 4A, the switching atomic two-electrode device includes an ion source electrode, an inactive electrode, and an ion channel layer interposed between the ion source electrode and the inactive electrode. The ion source electrode is a pure-metal electrode. The switching atomic two-electrode device includes no diffusion barrier layer.

Referring to FIG. 4B, the switching atomic two-electrode device includes an ion source electrode, an inactive electrode, and an ion channel layer interposed between the ion source electrode and the inactive electrode. The ion source electrode is a CuTe metal alloy electrode.

Referring to FIG. 4C, the switching atomic two-electrode device includes an ion source electrode, an inactive electrode, an ion channel layer interposed between the ion source electrode and the inactive electrode, and a diffusion barrier layer interposed between the ion channel layer and the ion source electrode. CuTe is applied to the ion source electrode to form a metal alloy electrode.

Referring to FIGS. 4A and 4B, it can be seen that the degree of variation (FIG. 4B) of the switching atomic two-electrode device employing a metal alloy electrode as the material of the ion source electrode is improved compared to the degree of variation (FIG. 4A) of the switching atomic two-electrode device employing a pure-metal electrode as the material of the ion source gate electrode.

Referring to FIG. 4C, it can be seen that the degree of variation of the switching atomic two-electrode device employing a metal alloy electrode as the ion source electrode and adopting a diffusion barrier layer is most greatly improved. This means that the operation of the switching atomic two-electrode device adopting the diffusion barrier layer is most stable.

Evaluation Example 2

Figure 5:
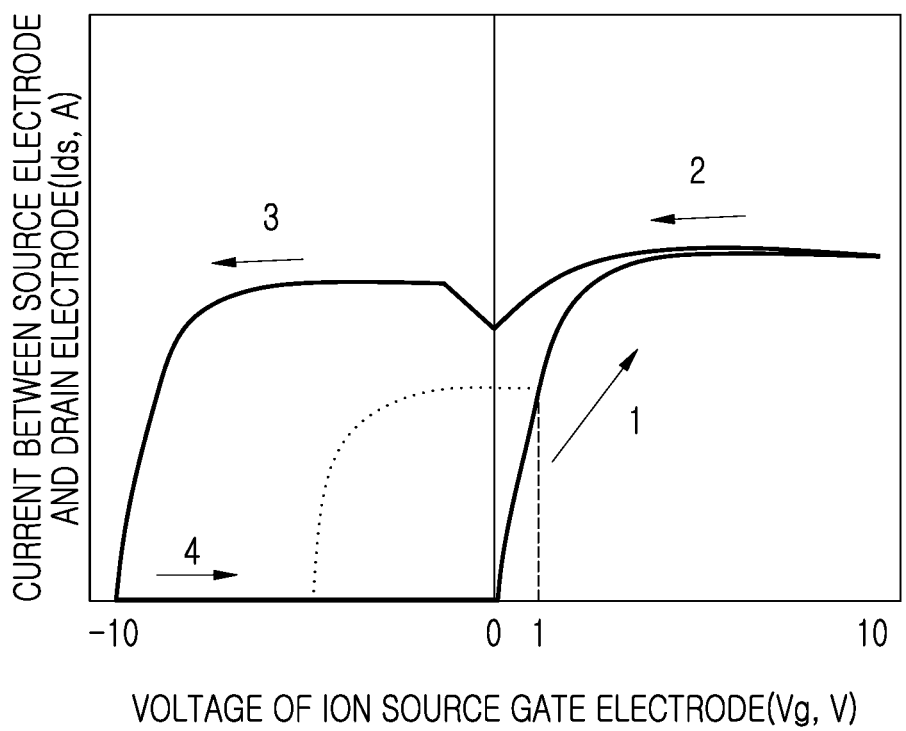
FIG. 5 is a graph illustrating operation of the switching atomic transistor according to an embodiment of the present invention.

FIG. 5 is a graph illustrating operation of the switching atomic transistor according to an embodiment of the present invention.

Referring to FIG. 5, it can be seen that a source-drain current increases in direction #1 as the voltage of the ion source gate electrode 160 increases and that a source-drain current is maintained or decreases in direction #2 as the voltage of the ion source gate electrode 160 decreases. This is a hysteresis loop different from conventional transistors.

Subsequently, it can be seen that a low resistance state is maintained when the voltage of the ion source gate electrode 160 is swept in the negative direction and then the low resistance state transitions to a high resistance state when a high negative voltage, such as approximately −10 V, is applied as the voltage of the ion source gate electrode 160.

When the voltage applied to the ion source gate electrode 160 is swept in the positive direction (direction #4) in the high resistance state, an electric current between the source electrode 130 and the drain electrode 120 is returned to an initial position, i.e., zero when the voltage of the ion source gate electrode 160 is zero.

In addition, when the voltage applied to the ion source gate electrode 160 is swept from 0 V to +1 V from the initial state and then the voltage of the ion source gate electrode 160 is swept again in the negative direction as shown in a dotted line, a hysteresis loop shape is shown in which the low resistance state is maintained during the initial decrease in the voltage of the ion source gate electrode 160 and the source-drain current decreases significantly to zero when the voltage of the ion source gate electrode 160 reaches a specific point. Accordingly, by adjusting the voltage applied to the ion source gate electrode 160, it is possible to use the switching atomic transistor as a multi-level non-volatile memory device.

Embodiment 2: Vertical Atomic Transistor

A vertical atomic transistor capable of high integration based on the same technical concept as the switching atomic transistor described in Embodiment 1 will be disclosed below. With respect to the same or similar elements to those of the switching atomic transistor of Embodiment 1, the descriptions thereof will be omitted to avoid repeat description, and the following description will focus on the characteristic structure and operation method of the vertical atomic transistor with reference to the drawings.

Figure 6:
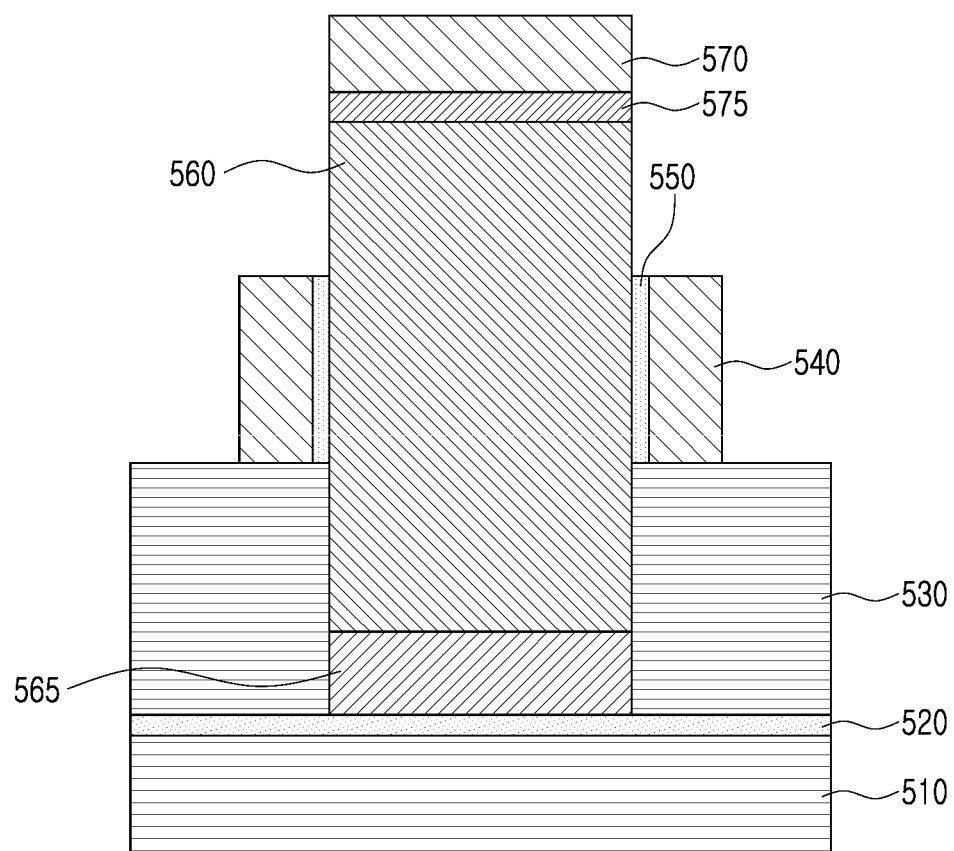
FIG. 6 is a sectional view of a vertical atomic transistor according to an embodiment of the present invention.

FIG. 6 is a sectional view of the vertical atomic transistor according to an embodiment of the present invention.

Referring to FIG. 6, a surface oxide layer 520 is disposed on a substrate 510, and a drain electrode 565 is formed on the surface oxide layer 520. An ion channel layer 560 is formed on a portion of the drain electrode 565 to have a height perpendicular to the substrate 510. A first oxide layer 530 is formed on the surface oxide layer 520 and the drain electrode 565 in a peripheral area in which the ion channel layer 560 is formed. The first oxide layer 530 has a thickness lower than the height of the ion channel layer 560 so that a portion of a side surface of the ion channel layer 560 is exposed. A first diffusion barrier layer 550 is formed in contact with the exposed side surface of the ion channel layer 560. An ion source gate electrode 540 is formed in contact with an outer surface of the first diffusion barrier layer 550. A second diffusion barrier layer 575 and a source electrode 570 are formed on the ion channel layer 560.

The substrate 510 may be formed of a material such as those described in Embodiment 1. The surface oxide layer 520 may be formed on the substrate 510. The surface oxide layer 520 may be formed of any one material selected from the group consisting of $SiO_2$, $Al_2O_3$, crystalline $SiO_2$, and crystalline $Al_2O_3$.

The drain electrode 565 may be formed of at least one material selected from the group consisting of p-doped Si, n-doped Si, WN, AlN, TaN, HfN, TiN, TiON, and WON.

The ion channel layer 560 formed on the drain electrode 565 may have a width of 1 nm to 100 nm and a height of 2 mm to 30 nm. The height of the ion channel layer 560 may determine the space between the drain electrode 565 and the source electrode 570.

The ion channel layer 560 may be formed of at least one material selected from the group consisting of CuInS, CuInSe, CuInS, CdInSe, MnInS, MnZnInS, ZnInSe, InS, InSSe, InSe, CdS, ZnCdS, ZnInS, a-Si, $SiO_2$, $Al_2O_3$, crystalline $SiO_2$, crystalline $Al_2O_3$, CuS, and metal oxides.

The first oxide layer 530 may be formed around the ion channel layer 560. According to another embodiment of the present invention, the first oxide layer 530 may be replaced with an ion channel layer forming layer 620. The first oxide layer 530 may have a thickness smaller than the height of the ion channel layer 560. Accordingly, a portion of a side surface of the ion channel layer 560 is exposed.

The first oxide layer 530 may be formed of at least one material selected from the group consisting of CuInS, CuInSe, CuInS, CdInSe, MnInS, MnZnInS, ZnInSe, InS, InSSe, InSe, CdS, ZnCdS, ZnInS, a-Si, $SiO_2$, $Al_2O_3$, crystalline $SiO_2$, crystalline $Al_2O_3$, CuS, and metal oxides.

The first diffusion barrier layer 550 is formed on the exposed portion of the side surface of the ion channel layer 560. The first diffusion barrier layer 550 may be formed of a conductive nitride. For example, the first diffusion barrier layer 550 may be formed of at least one material selected from the group consisting of WN, AlN, TaN, HfN, GaN, $SiN_x$, and $Si_3N_4$, but the present invention is not limited thereto. The first diffusion barrier layer 550 may have a thickness of 0.4 nm to 5 nm, but the present invention is not limited thereto. The first diffusion barrier layer 550 can suppress fatigue that may occur in the ion channel layer 560 due to repeated operation of the vertical atomic transistor to improve stability of the vertical atomic transistor.

The ion source gate electrode 540 may be formed on the outer surface of the first diffusion barrier layer 550. The ion source gate electrode 540 may be a metal that has a high diffusion coefficient in a solid so that metal ions can migrate due to an electric field. For example, the ion source gate electrode 540 may be formed of any one material selected from the group consisting of Cu, Ag, and alloys thereof, but the present invention is not limited thereto. The ion source gate electrode 540 may be formed by performing sulphidation on at least one of Cu, CuTe, and Ag through chemical vapour deposition (CVD). The ion source gate electrode 540 may have a thickness of 1 nm to 100 nm, but the present invention is not limited thereto.

The second diffusion barrier layer 575 is formed on the ion channel layer 560. The second diffusion barrier layer 575 may be formed of a conductive nitride. The second diffusion barrier layer 575 may have a thickness of 0.4 nm to 5 nm, but the present invention is not limited thereto.

The second diffusion barrier layer 575 may be formed of at least one material selected from the group consisting of WN, AlN, TaN, HfN, GaN, $SiN_x$, and $Si_3N_4$.

Optionally, a second oxide layer formed on a side surface of the second diffusion barrier layer 575 and configured to shield the exposed portion of the side surface of the ion channel layer 560 may be formed over the first oxide layer 530.

The second oxide layer (not shown) may be formed of at least one material selected from the group consisting of CuInS, CuInSe, CuInS, CdInSe, MnInS, MnZnInS, ZnInSe, InS, InSSe, InSe, CdS, ZnCdS, ZnInS, a-Si, $SiO_2$, $Al_2O_3$, crystalline $SiO_2$, crystalline $Al_2O_3$, CuS, and metal oxides.

The source electrode 570 is formed on the second diffusion barrier layer 575. The source electrode 570 may be formed of at least one material selected from the group consisting of Cu, Ag, and alloys thereof. For example, the material may include, but is not limited to, $Cu_2S$, CuTeS, Ag, CuTeGe, AgSe, CuTeSi, and $Ag_2S$.

Figure 7:
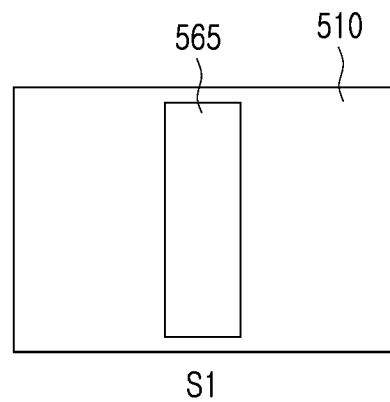
FIG. 7 is a plan view showing a process of producing the vertical atomic transistor according to an embodiment of the present invention.
Figure 7:
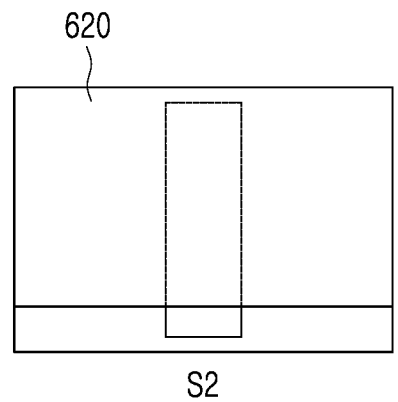
Figure 7:
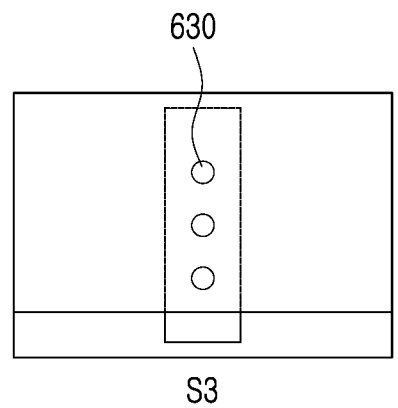
Figure 7:
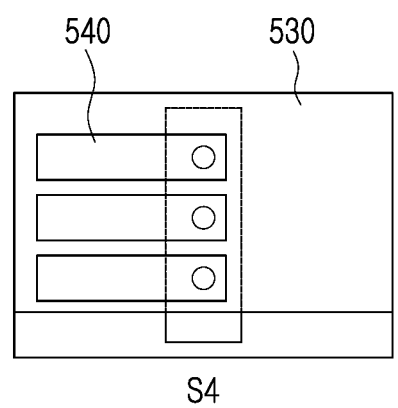
Figure 7:
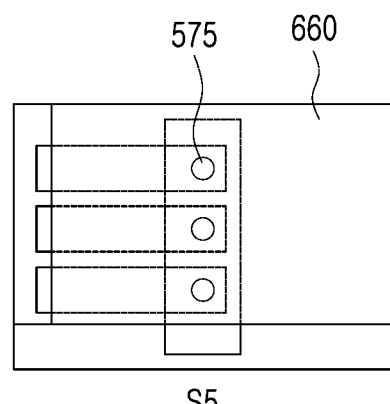
Figure 7:
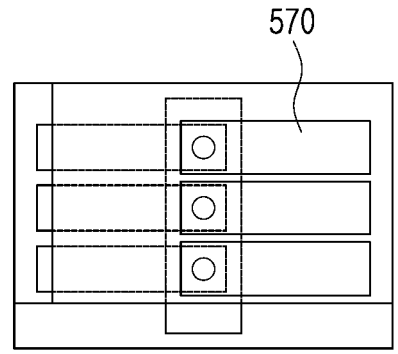

FIG. 7 is a plan view showing a process of producing the vertical atomic transistor according to an embodiment of the present invention.

In order to describe FIG. 7, the reference numerals of FIG. 6 will be used for elements not shown in FIG. 7.

Referring to FIG. 7, first, a drain electrode 565 is formed on a substrate 510 (S1). The drain electrode 565 may be formed using a known patterning process and metal deposition technique used in a semiconductor process without particular limitation.

An ion channel layer forming layer 620 is formed on the drain electrode 565 and the substrate 510 (S2). As described with reference to FIG. 1, a first oxide layer 530 and an ion channel layer forming layer 620 may be selectively formed. When the ion channel layer forming layer 620 is formed, an ion channel layer 560 may be formed using the ion channel layer forming layer 620 in subsequent processes.

An etch mask 630 is formed over the ion channel layer forming layer 620 and then is used to etch out a portion of the ion channel layer forming layer 620 (S3). The etch mask 630 may be obtained by patterning a photoresist through a known photolithography process used in a semiconductor process. Alternatively, the etch mask 630 may be a hard mask. For example, the etch mask may be formed of $SiN_x$, but the present invention is not limited thereto.

An area that is not etched out of the ion channel layer forming layer 620 due to the etch mask 630 forms an ion channel layer 560. By stopping the etching before all of the ion channel layer forming layer 620 is etched out, the remaining ion channel layer forming layer 620 may serve as the first oxide layer 530.

A first diffusion barrier layer 550 and an ion source gate electrode 540 are stacked on an entire surface of a structure including the side surface of the ion channel layer 560 exposed by etching out a portion of the ion channel layer forming layer 620, and patterned (S4).

A second oxide layer 660 is formed on the ion source gate electrode 540, and then the mask 630 is removed to expose an upper surface of the ion channel layer 560. A second diffusion barrier layer 575 is formed on the upper surface of the ion channel layer 560 which is exposed by removing the mask 630 (S5).

A source electrode 570 is formed on the second diffusion barrier layer 575 to produce the vertical atomic transistor (S6).

Figure 8:
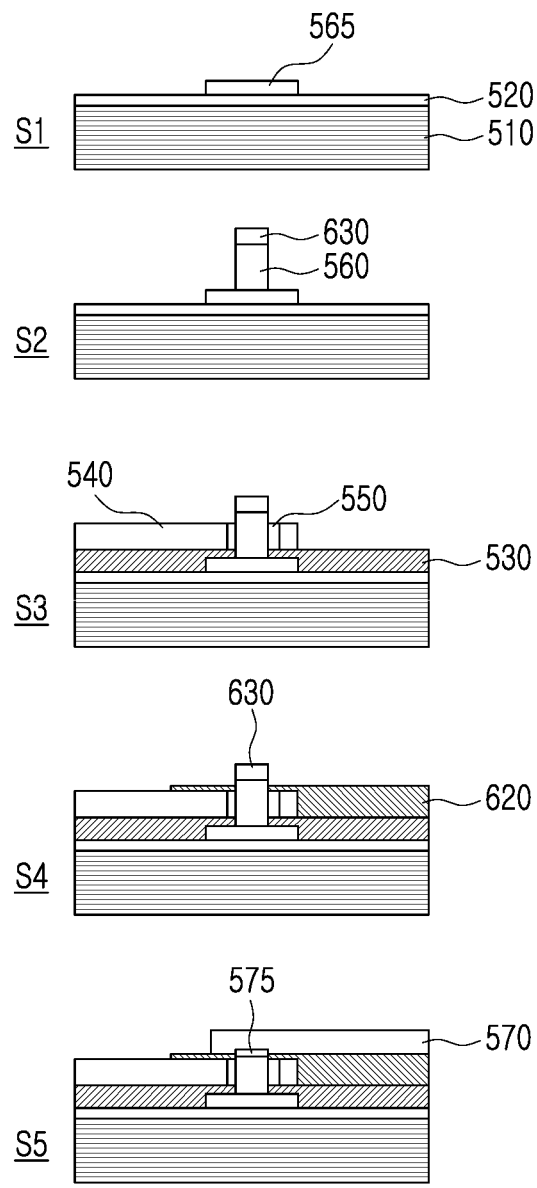
FIG. 8 is a sectional view showing the process of producing the vertical atomic transistor according to an embodiment of the present invention.

FIG. 8 is a sectional view showing the process of producing the vertical atomic transistor according to an embodiment of the present invention.

Referring to FIG. 8, a surface oxide layer 520 is formed on a substrate 510. A drain electrode 565 is formed on the surface oxide layer 520 (S1).

An ion channel layer is formed on the drain electrode 565, and an etch mask 630 is formed on the ion channel layer to etch the ion channel layer 560 (S2). Since a first oxide layer 530 is used unlike FIG. 7, the ion channel layer 560, except for a part where the etching is prevented by the etch mask 630, is etched out completely.

The first oxide layer 530 is formed on the surface oxide layer 520 and the drain electrode 565 in a peripheral area of the ion channel layer 560. The first oxide layer 530 has a thickness such that a portion of a side surface of the ion channel layer 560 can be exposed. A first diffusion barrier layer 550 and an ion source gate electrode 540 are deposited on an entire surface of the structure and patterned (S3).

A second oxide layer 620 is formed on the structure to expose a portion of the ion source gate electrode 540. A second diffusion barrier layer 575 is formed on an upper surface of the ion channel layer 560 which is exposed from the second oxide layer 620 by removing the mask 630. A source electrode 570 is formed on the second diffusion barrier layer 575 and the structure to produce the vertical atomic transistor according to an embodiment of the present invention.

Manufacturing Example 5

A silicon dioxide surface oxide layer 520 was formed on a silicon wafer substrate 510, and a drain electrode 565 was formed on the surface oxide layer 520. The drain electrode 565 was formed of TaN and to a thickness of 20 nm. An ion channel forming layer 620 was formed on the drain electrode 565. The ion channel forming layer 620 was formed by depositing CuTeS to a thickness of 30 nm. An etch mask 630 was formed on the ion channel forming layer 620, the ion channel forming layer 620 was eached using the etch mask 630 to forming an ion channel layer 560 having a height of 30 nm under the etch mask, and to leave the CuTeS layer with a thickness of 5 nm to 10 nm in a peripheral area of the ion channel layer to serve the same role as the first oxide layer 530. A first diffusion barrier layer 550 was formed of WN with a thickness of 10 nm and on an exposed side surface of the ion channel layer 560, and an AgCu ion source gate electrode 540 was formed on another side surface of the first diffusion barrier layer 550 and to a thickness of 20 nm. Subsequently, a second oxide layer 620 was formed by stacking AlN with a thickness of 20 nm. A second diffusion barrier layer 575 was formed of WN with a thickness of 5 nm and on an upper surface of the ion channel layer 560 exposed by removing the etch mask 630, and an AgCu source electrode 570 was formed on the second diffusion barrier layer 575 and to a thickness of 20 nm. Chemical vapor deposition and atomic layer epitaxy were used to form the electrode layer, insulating layer, and resistive layer.

Manufacturing Example 6

A drain electrode 565 was formed on a silicon wafer substrate, and a first oxide layer 530 of aluminum nitride was formed on the drain electrode 565 to a thickness of 20 nm. The first oxide layer 530 is etched to form an ion channel layer 560 with a height of 30 nm and a diameter of 10 nm. Subsequently, a first diffusion barrier layer 550, an ion source gate electrode 540, a second oxide layer 620, a second diffusion barrier layer 575 and a source electrode 570 were formed using the same methods as described above in manufacturing example 5.

Figure 9:
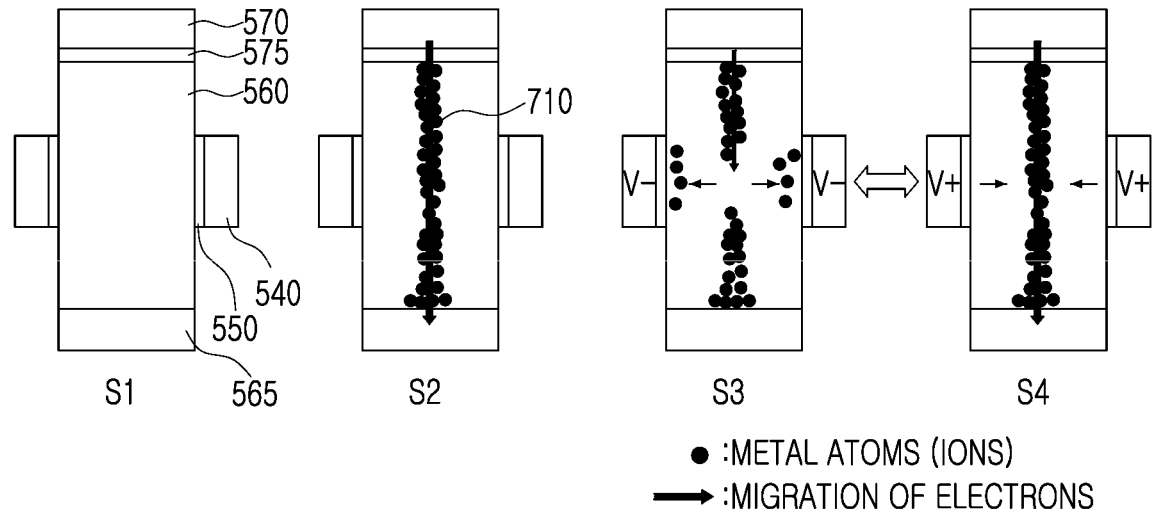
FIG. 9 is a diagram illustrating operation of the vertical atomic transistor according to an embodiment of the present invention.

FIG. 9 is a diagram illustrating operation of the vertical atomic transistor according to an embodiment of the present invention.

Referring to FIG. 9, by applying a positive overvoltage to a source electrode 570 during an initial state, metal ions of the source electrode 570 moves to an ion channel layer 560 through a second diffusion barrier layer 575 (S1).

A conductive bridge 710 for connecting the source electrode 570 and a drain electrode 565 is formed inside the ion channel layer 560 (S2). A source-drain current flows due to the formation of the conductive bridge 710. This state is called a forming state.

When a negative voltage is applied to an ion source gate electrode 540, ions forming the conductive bridge 710 inside the ion channel layer 560 migrate toward a first diffusion barrier layer 550 (S3). As the conductive bridge 710 is broken, the ion channel layer 560 becomes a high resistance state, and a source-drain current no longer flows.

When a positive voltage is applied to the ion source gate electrode 540, the ions migrate to a center portion of the ion channel layer 560 to form the conductive bridge 710 again (S4). Accordingly, the vertical atomic transistor becomes a low resistance state in which a source-drain current flows again.

The forming is once performed, but steps S3 and S4 may be repeatedly performed to control operation of the vertical atomic transistor.

Figure 10:
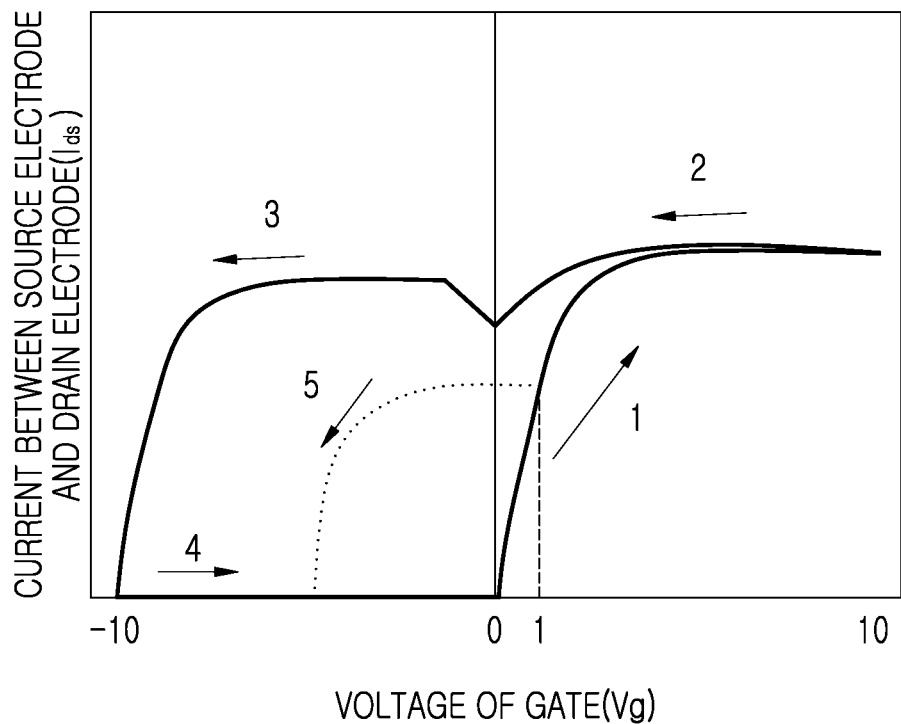
FIG. 10 is a graph showing a change in a source-drain current according to a gate voltage of the vertical atomic transistor produced according to an embodiment of the present invention.

FIG. 10 is a graph showing a change in a source-drain current according to a gate voltage of the vertical atomic transistor produced according to an embodiment of the present invention.

Referring to FIG. 10, it can be seen that a source-drain current increases in direction #1 as a voltage of the ion source gate electrode 540 increases and that a source-drain current is maintained or decreases in direction #2 as the voltage of the ion source gate electrode 540 decreases. This is a hysteresis loop different from conventional transistors.

Subsequently, it can be seen that a low resistance state is maintained when the voltage of the ion source gate electrode 540 is swept in the negative direction and then the low resistance state transitions to a high resistance state when a high negative voltage, such as approximately −10 V, is applied as the voltage of the ion source gate electrode 540.

When the voltage applied to the ion source gate electrode 540 is swept in the positive direction (direction #4) in the high resistance state, an electric current between the source electrode 570 and the drain electrode 565 is returned to an initial position, i.e., zero when the voltage of the ion source gate electrode 540 is zero.

In addition, when the voltage applied to the ion source gate electrode 540 is swept from 0 V to +1 V in the initial state and then the voltage of the ion source gate electrode 540 is swept again in the negative direction as shown in the dotted line (direction #5), a hysteresis loop shape is shown in which the low resistance state is maintained during the initial decrease in the voltage of the ion source gate electrode 540 and the source-drain current decreases significantly to zero when the voltage of the ion source gate electrode 540 reaches a specific point. The electric current between the source electrode 570 and the drain electrode 565 may vary depending on the voltage of the ion source gate electrode 540. The shape of the hysteresis loop according to the voltage of the ion source gate electrode 540 is similar.

Also, even when a conductive bridge is formed or removed according to a voltage sweep of the ion source gate electrode 540 and then power applied to the device is cut off, the state of the conductive bridge in the ion channel layer 560 is maintained. Subsequently, when power is supplied to the device again, an electric current corresponding to stored data may be obtained because the state of the conductive bridge is maintained. Accordingly, by adjusting the voltage applied to the ion source gate electrode 540 of the vertical atomic transistor of the present invention, it is possible to use the vertical atomic transistor as a multi-level non-volatile memory device.

It should be understood that the embodiments disclosed herein are merely illustrative and are not intended to limit the scope of the invention. It will be apparent to those skilled in the art that other modifications based on the technical spirit of the present invention, in addition to the embodiments disclosed herein, can be practiced.

The invention claimed is:

1. A vertical atomic transistor comprising:
a substrate;
a drain electrode formed on the substrate;
an ion channel layer formed on the drain electrode and disposed perpendicularly to the substrate;
a first diffusion barrier layer formed on a side surface of the ion channel layer;
an ion source gate electrode formed in contact with an outer surface of the first diffusion barrier layer;
a second diffusion barrier layer formed on the ion channel layer; and
a source electrode formed on the second diffusion barrier layer.

2. The vertical atomic transistor of claim 1, further comprising a first oxide layer formed between the ion source gate electrode and the substrate to space the drain electrode apart from the ion source gate electrode.

3. The vertical atomic transistor of claim 2, wherein the first oxide layer is formed of at least one material selected from a group consisting of CuInSe, CuInS, CdInSe, MnInS, MnZnInS, ZnInSe, InS, InSSe, TnSe, CdS, ZnCdS, ZnInS, a-Si, $SiO_2$, $Al_2O_3$, crystalline $SiO_2$, crystalline $Al_2O_3$, CuS, and metal oxides.

4. The vertical atomic transistor of claim 2, wherein the first oxide layer is formed under the first diffusion barrier layer and in contact with a lower area of the ion channel layer that is in contact with the first diffusion barrier layer.

5. The vertical atomic transistor of claim 4, wherein the first oxide layer completely shields a side surface of the drain electrode.

6. The vertical atomic transistor of claim 2, further comprising a second oxide layer formed on a side surface of the second diffusion barrier layer over the first oxide layer to shield a portion of an exposed side surface of the ion channel layer.

7. The vertical atomic transistor of claim 6, wherein the second oxide layer is formed of at least one material selected from a group consisting of CuInSe, CuInS, CdInSe, MnInS, MnZnInS, ZnInSe, InS, InSSe, InSe, CdS, ZnCdS, ZnInS, a-Si, $SiO_2$, $Al_2O_3$, crystalline $SiO_2$, crystalline $Al_2O_3$, CuS, and metal oxides.

8. The vertical atomic transistor of claim 1, wherein a surface oxide layer is further formed between the substrate and the drain electrode to achieve electrical insulation between the substrate and the drain electrode, and the surface oxide layer is formed of at least one material selected from a group consisting of $SiO_2$, $Al_2O_3$, $ZrO_2$, $TaO_2$, $TiO_2$, $BaTiO_2$, $HfO_2$, and $Cu_2O$.

9. The vertical atomic transistor of claim 1, wherein the drain electrode is formed of at least one material selected from a group consisting of p-doped Si n-doped Si, WN, AlN, TaN, HfN, TiN, TiON, and WON.

10. The vertical atomic transistor of claim 1, wherein the ion channel layer is formed of at least one material selected from a group consisting of CuInSe, CuInS, CdInSe, MnInS, MnZnInS, ZnInSe, InS, InSSe, InSe, CdS, ZnCdS, ZnInS, a-Si, $SiO_2$, $Al_2O_3$, crystalline $SiO_2$, crystalline $Al_2O_3$, CuS, and metal oxides.

11. The vertical atomic transistor of claim 1, wherein the first diffusion barrier layer or the second diffusion barrier layer is formed of at least one material selected from a group consisting of WN, AlN, TaN, HfN, GaN, $SiN_x$, and $Si_3N_4$.

12. The vertical atomic transistor of claim 1, wherein the ion source gate electrode is formed of at least one material selected from a group consisting of Cu, Ag, and alloys thereof.

13. The vertical atomic transistor of claim 1, wherein the source electrode is formed of at least one material selected from a group consisting of Cu, Ag, and alloys thereof.

14. A method of operating a vertical atomic transistor having, an ion channel layer formed perpendicularly to a substrate, a source electrode and a drain electrode formed over and under the ion channel layer, a first diffusion barrier layer formed on a side surface of the ion channel layer, and an ion source gate electrode formed in contact with an outer surface of the first diffusion barrier layer, the method comprising:
    applying an overvoltage to the source electrode so that metal ions migrate from the source electrode into the ion channel layer to form a conductive bridge;
    applying a negative voltage to the ion source gate electrode so that the ions forming the conductive bridge in the ion channel layer migrate toward a first diffusion prevention layer to remove a portion of the conductive bridge; and
    applying a positive voltage to the ion source gate electrode so that the ions forming the conductive bridge in the ion channel layer migrate to a center of the ion channel layer to form the conductive bridge.

15. The method of claim 14, wherein the formation or elimination of the conductive bridge in the ion channel layer is maintained even when no voltage is applied to the source electrode, the drain electrode, and the ion source gate electrode.

16. The method of claim 14, wherein the applying of a negative voltage to the ion source gate electrode so that the ions forming the conductive bridge in the ion channel layer migrate toward a first diffusion prevention layer to remove a portion of the conductive bridge; and the applying of a positive voltage to the ion source gate electrode so that the ions forming the conductive bridge in the ion channel layer migrate to a center of the ion channel layer to form the conductive bridge comprise providing a multi-level resistance value by applying different voltages on a step basis to adjust the number of ions migrated in the ion channel layer.

* * * * *